United States Patent
Krishnamoorthy et al.

(10) Patent No.: US 8,026,111 B2
(45) Date of Patent: Sep. 27, 2011

(54) DIELECTRIC ENHANCEMENTS TO CHIP-TO-CHIP CAPACITIVE PROXIMITY COMMUNICATION

(75) Inventors: Ashok Krishnamoorthy, San Diego, CA (US); John E. Cunningham, San Diego, CA (US)

(73) Assignee: Oracle America, Inc., Redwood City, CA (US)

( * ) Notice: Subject to any disclaimer, the term of this patent is extended or adjusted under 35 U.S.C. 154(b) by 289 days.

(21) Appl. No.: 12/391,912

(22) Filed: Feb. 24, 2009

(65) Prior Publication Data

US 2010/0213606 A1  Aug. 26, 2010

(51) Int. Cl.
*H01L 21/00* (2006.01)
*H01L 29/76* (2006.01)
(52) U.S. Cl. ............ 438/3; 438/107; 438/381; 257/295; 257/723; 257/310; 257/E23.144; 257/E21.208
(58) Field of Classification Search .............. 438/3, 107, 438/381; 257/295, 310, 723, 777, E23.144
See application file for complete search history.

(56) References Cited

U.S. PATENT DOCUMENTS

| | | | | | |
|---|---|---|---|---|---|
| 5,012,321 | A | * | 4/1991 | Magarshack | 257/664 |
| 5,777,356 | A | * | 7/1998 | Dhote et al. | 257/295 |
| 6,331,926 | B1 | * | 12/2001 | Anthony | 361/56 |
| 6,448,098 | B1 | * | 9/2002 | Milor | 438/17 |
| 6,916,719 | B1 | * | 7/2005 | Knight et al. | 438/381 |
| 7,384,856 | B2 | * | 6/2008 | Das et al. | 438/396 |
| 7,675,388 | B2 | * | 3/2010 | Cardona et al. | 333/133 |
| 2005/0258529 | A1 | * | 11/2005 | Green et al. | 257/686 |
| 2007/0139976 | A1 | * | 6/2007 | deRochemont | 363/17 |
| 2008/0087459 | A1 | * | 4/2008 | Das et al. | 174/260 |

* cited by examiner

*Primary Examiner* — Nitin Parekh
(74) *Attorney, Agent, or Firm* — Osha • Liang LLP

(57) ABSTRACT

A method for improving signal levels between capacitively-coupled chips in proximity communication (PxC) includes depositing a high permittivity dielectric material layer over a signal pad of a first chip, and placing a second chip in close proximity to the first chip such that faces of the signal pads align to enable for capacitive signal coupling. The high permittivity dielectric material layer that fills at least a portion of a gap between the first chip and the second chip, and improves capacitive coupling between signal pads of the first chip and the second chip by providing for an increased permittivity in the gap between the first chip and the second chip. The increased permittivity ensures that electric fields are substantially confined to a space between the signal pad of the first chip and the signal pad of the second chip.

22 Claims, 6 Drawing Sheets

DIELECTRIC ENHANCEMENTS TO CHIP-TO-CHIP CAPACITIVE PROXIMITY COMMUNICATION

BACKGROUND OF INVENTION

1. Field of the Invention

The present invention relates generally to a method for increasing signal coupling between pads of chips engaged in capacitive proximity communication (PxC). More specifically, the present invention relates to a method for increasing signal coupling, where a high permittivity dielectric material is directly deposited atop the pads to enable confinement of electric fields within pad gaps of the chips.

2. Background Art

With scaling of processor technology to future generational requirements, the pressing need for increased serial data rate over many communication channels to off-chip memory is not eased by the inability of electrical signaling to drive off-chip structures efficiently due to mismatch between on-chip and off-chip bandwidths. Thus, the ability of processors to exploit advancements in computational power, clock frequency, transistor count, multi-core architectures and the like is limited. One way to circumvent the aforementioned limitation is to employ PxC as a means to signal between processor and memory.

PxC is a form of wireless communication between chips, with the possible chip-to-chip coupling being capacitive, inductive or optical. Capacitive coupling may be employed to provide a high-bandwidth and high density channel between two chips placed face-to-face and extremely close to each other such that the transmitter circuits of one chip align with the receiver circuits of the other. An input/output (I/O) technology using the capacitive coupling of PxC can scale with on-chip features unlike traditional area ball bonds, leading to a largely improved I/O density. Thus, PxC with capacitive coupling offers the advantages of a hundred-fold increase in bandwidth density with a simultaneous three-fold reduction of on-chip power dissipation over traditional off-chip I/O signaling, thereby aiding utility in applications with power hungry, I/O limited multi-chip systems.

FIG. 1 shows two chips (110, 120) placed close to each other in a capacitively coupled PxC mode. Each chip includes transmitter (114, 122) and receiver circuits (112, 124), where a transmitter circuit of one chip (114, 122) communicates with the receiver circuit (112, 124) of the other chip by way of a metal plate on one chip and the metal plate on the other chip forming a capacitor. The metal plates of the transmitter circuit (114, 122) are depicted as shaded rectangles and the metal plates of the receiver circuit (112, 124) are depicted as non-shaded rectangles. A metal plate on the transmitter side is driven by the transmitter circuit (114, 122) and a metal plate on the receiver side drives the receiver circuit (112, 124).

When the two chips (110, 120) are moved close to each other, the surfaces of the dielectric and passivation layer touch each other, thereby allowing for excellent capacitive coupling between the metal plates due to their proximity. Also, the sizes of the transmitter and receiver structures may be reduced, allowing for reduced parasitic capacitances and huge power savings. The need for electrostatic discharge (ESD) protection devices is dispensed with as the metal plates lie under the passivation layer. This contributes to an additional reduction in capacitance and power consumption.

FIG. 2 shows a typical cross-section of transmitter 212 and receiver 222 pads of two chips (210, 220) involved in capacitive PxC. Communication between the transmitter 212 and receiver 222 pads is affected by three capacitances in positive and negative ways. The desired capacitance, i.e., the signal capacitance $C_s$, is the capacitance between the transmitter 212 and the receiver 222 pads. The unwanted capacitance due to coupling between adjacent transmitter 212 and receiver 222 pads is the noise capacitance $C_n$. As shown in FIG. 2, guard rings 224 may be provided between receiver 222 pads to suppress crosstalk between individual pads. However, an unwanted parasitic capacitance $C_p$ may have to be factored into received signal calculations. This parasitic capacitance $C_p$ may arise due to coupling between receiver 222 pads and guard rings 224, coupling between receiver 222/transmitter 212 pads and the ground plane, and/or intrinsic capacitance. Thus, these capacitances depend on inter-pad distance and inter-chip distance. Conservation of charge deems that the received signal, $V_r$, is dependent on the capacitances, and may be obtained from example Equation (1) as follows.

$$(C_s + C_n + C_p)V_r = V_s C_s \qquad (1)$$

where $V_s$ is the source signal. The received signal, $V_r$, as a function of capacitances, may, therefore, be expressed as:

$$V_r = \frac{C_s V_s}{(C_s + C_n + C_p)} \qquad (2)$$

Assuming equal dimensions w×l of two plates, equal plate thickness of t, and a separation between plates d, the capacitance C between two plates may be expressed as:

$$C = \frac{\varepsilon}{d}\left(w - \frac{t}{2}\right)\left(l - \frac{t}{2}\right) + \pi\varepsilon(l + w)f\left(\frac{d}{2}, t\right), \qquad (3)$$

where $\varepsilon = \varepsilon_0 \varepsilon_r$ is the permittivity of the medium between the two plates, $\varepsilon_0$ being the permittivity of free space and $\varepsilon_r$ being the dielectric constant of the medium between the two plates, and f(d,t) is given by:

$$f(d, t) = \frac{1}{\left[\ln\left(1 + \frac{2d}{t} + \sqrt{\frac{2d}{t}\left(\frac{2d}{t} + 2\right)}\right)\right]} \qquad (4)$$

Using the method of images, Equation (3) is obtained by modeling the fringing fields of a rectangular micro-strip line over a ground plane as field lines due to a ground plane between two plates. Equation (3) does not account for the capacitance due to the four corners of the plates, which however is very small, but accounts for both the fringing fields and the parallel plate component. Equation (3) may be used to model the capacitance between transmitter 212 and receiver 222 pads, or any two finite pads separated by a small distance.

The crosstalk problem that arises in PxC may be due to fringing fields emanating from the length and width of the transmitter 212 pad not being coupled to the receiver 222 pad above and below the transmitter 212 pad (a receiver 222 pad above is not shown in FIG. 2). The crosstalk capacitance $C_{ct1}$ may be modeled by subtracting from the capacitance when the receiver 222 pad is infinite the capacitance when the receiver 222 pad is of the same dimensions as the transmitter 212 pad, and may be expressed as:

$$C_{ct} = \pi\varepsilon(l + w)\left(f(d, t) - 0.5f\left(\frac{d}{2}, t\right)\right) \qquad (5)$$

The crosstalk problem may also have a contribution from two adjacent receiver 222 pads forming a parallel plate capacitor between each other, where the thickness of the pad contributes mainly to the capacitance $C_{ct2}$, which may be expressed as:

$$C_{ct2} = \varepsilon\left(\frac{tl}{(p-w)} + Af\left(\frac{(p-w)}{2}, w\right) + 1.47l\right), \quad (6)$$

where p is the center to center distance between adjacent pads, and A may be expressed as:

$$A = 0.5\pi(t+l)\left(1 - 0.0543\frac{w}{(p-w)}\right) \quad (7)$$

Typically, field lines from receiver 222 pads are not only coupled to adjacent receiver 222 pads but also coupled to the transmitter 212 plates below (not shown in FIG. 2). Therefore, the capacitance $C_{ct2}$ reduces by a fraction, and may be expressed as:

$$C_{ct2} = \varepsilon\left(\frac{d}{p-w+d}\right)\left(\frac{tl}{(p-w)} + Af\left(\frac{(p-w)}{2}, w\right) + 1.47l\right) \quad (8)$$

Misalignment is another problem in PxC. FIG. 3 shows a one-dimensional misalignment between two plates 310 and 320 in the direction of the width w. $w_1$ is the width of receiver 310 plate that overlaps with a transmitter plate 320, whose width of non-overlap is $w_2$. Thus, w can be expressed as:

$$w = w_1 + w_2 \quad (9)$$

The capacitance $C_{ma}$ between two misaligned parallel plates 310 and 320 may be approximately expressed as:

$$C_{ma} = \varepsilon\left(\frac{w_1 l}{d} + \pi w_1 f\left(\frac{d}{2}, t\right) + \pi lf\left(\sqrt{0.25(d^2 + w_2^2)}, t\right)\right) \quad (10)$$

With the rapid changing status quo of Silicon technology, PxC requires chip separation on the order of 10 microns, which would shrink to smaller levels with future generation technology. In order to ensure high fidelity transmission of data streams with very low power and ultra-high density, gap requirements of a few microns and even sub-micron gaps may be the order of the day. Typical low-cost chip manufacturing processes achieve tolerances that are no better than a few mils (1 mil=25.4 microns).

FIG. 4 shows the plot of signal levels in flinging fields that are potential contributors to crosstalk in a dense PxC array as a function of chip separation for different pad dimensions. The x-axis denotes chip separation 410 in microns, and the y-axis signal levels 420 expressed as a percentage. Three different pad dimensions are chosen, viz. 1 micron pads 430, 10 micron pads 440, and 50 micron pads 450. FIG. 4 clearly demonstrates that when pad sizes are reduced to convenience high-density packaging, the signal levels coupled from pad to pad decrease with increase in chip separation 410. Alternatively, signal levels 420 in fringe fields increase with increase in chip separation 410.

SUMMARY OF INVENTION

In general, in one aspect, the present invention relates to a method for improving signal levels between capacitively-coupled chips in PxC. The method includes the steps of depositing a high permittivity dielectric material layer over a signal pad of a first chip, and placing a second chip in close proximity to the first chip such that faces of the signal pads align to enable for capacitive signal coupling. The high permittivity dielectric material layer that fills at least a portion of a gap between the first chip and the second chip, and improves capacitive coupling between signal pads of the first chip and the second chip by providing for an increased permittivity in the gap between the first chip and the second chip. The increased permittivity ensures that electric fields are substantially confined to a space between the signal pad of the first chip and the signal pad of the second chip.

In general, in one aspect, the present invention relates to a processing unit that provides for increased signal coupling between capacitively-coupled chips. The processing unit includes a first semiconductor chip having a signal pad atop which a high permittivity dielectric material layer is deposited, and a second semiconductor chip in proximity to the first semiconductor chip such that a face of a signal pad of the second chip is aligned with a face of the signal pad of the first chip to enable for capacitive signal coupling. The face of the signal pad of the first chip is an area of deposition of the high permittivity dielectric material layer that fills at least a portion of a gap between the first chip and the second chip. The high permittivity dielectric material layer improves capacitive coupling between signal pads of the first chip and the second chip by providing for an increased permittivity in the gap between the first chip and the second chip. The increased permittivity ensures that electric fields are substantially confined to a space between the signal pad of the first chip and the signal pad of the second chip.

Other aspects and advantages of the invention will be apparent from the following description and the appended claims.

DETAILED DESCRIPTION

Figure 1:
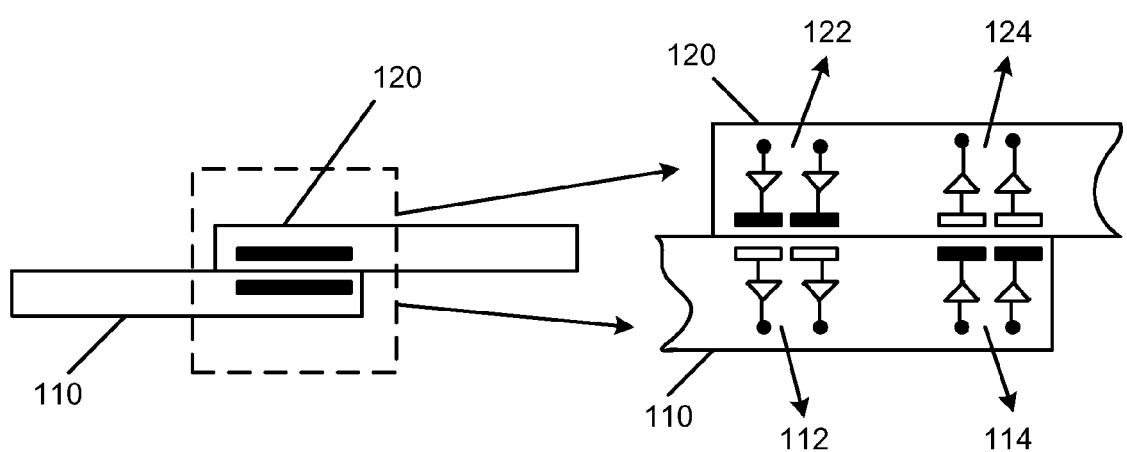
FIG. 1 shows two chips placed close to each other in a capacitively-coupled PxC mode.
Figure 2:
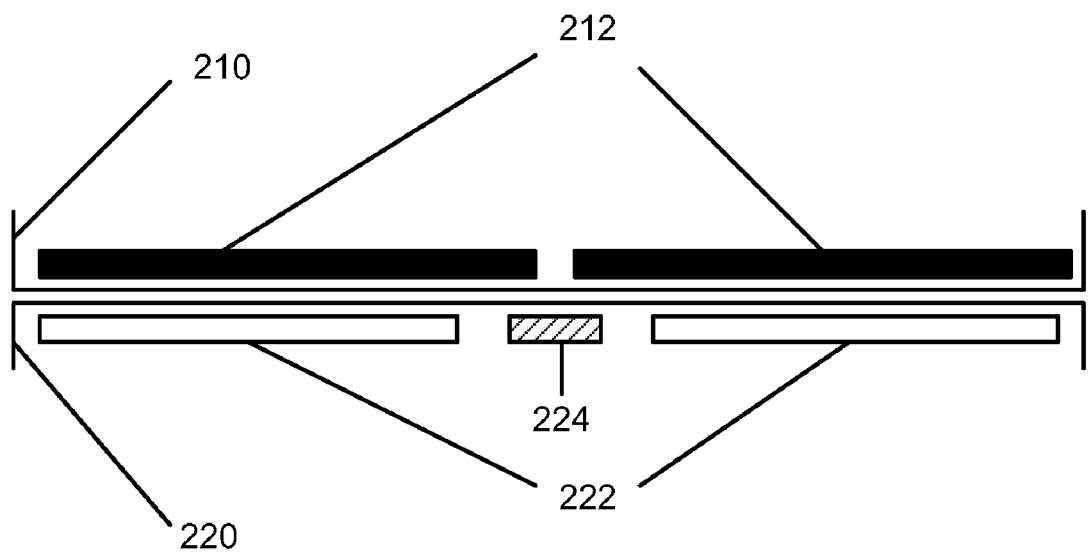
FIG. 2 shows a cross-section of transmitter and receiver pads of two chips involved in capacitive PxC.
Figure 3:
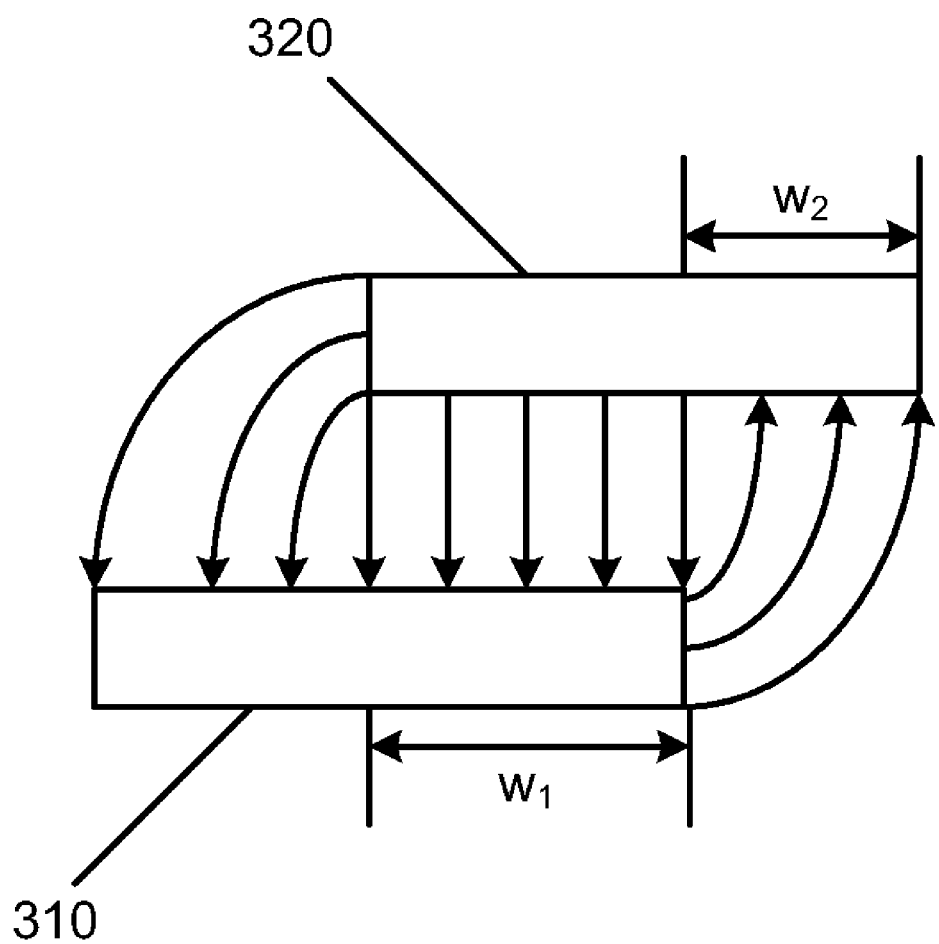
FIG. 3 shows a one-dimensional misalignment between two plates engaged in capacitive PxC in the direction of the width.
Figure 4:
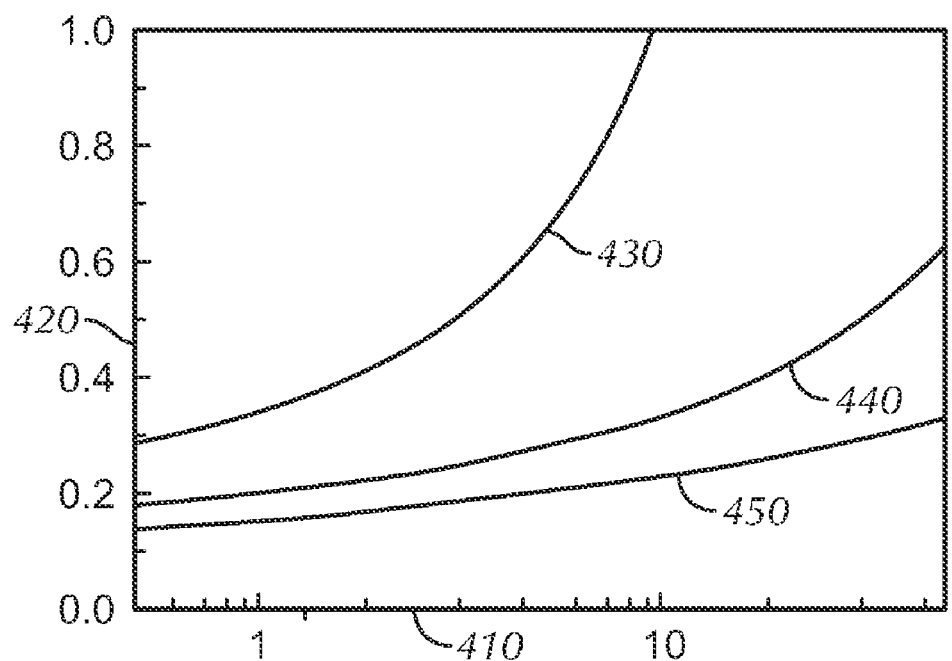
FIG. 4 shows the plot of signal levels in fringing fields that are potential contributors to crosstalk in a dense PxC array as a function of chip separation for different pad dimensions.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

In general, embodiments of the present invention describe a specific method for increasing coupling between signal pads of chips in a PxC configuration by depositing a layer of a high permittivity dielectric material directly atop signal pads. In one or more embodiments, such a high permittivity dielectric material may provide for electric field confinement in the gap between signal pads of the chips.

Figure 5:
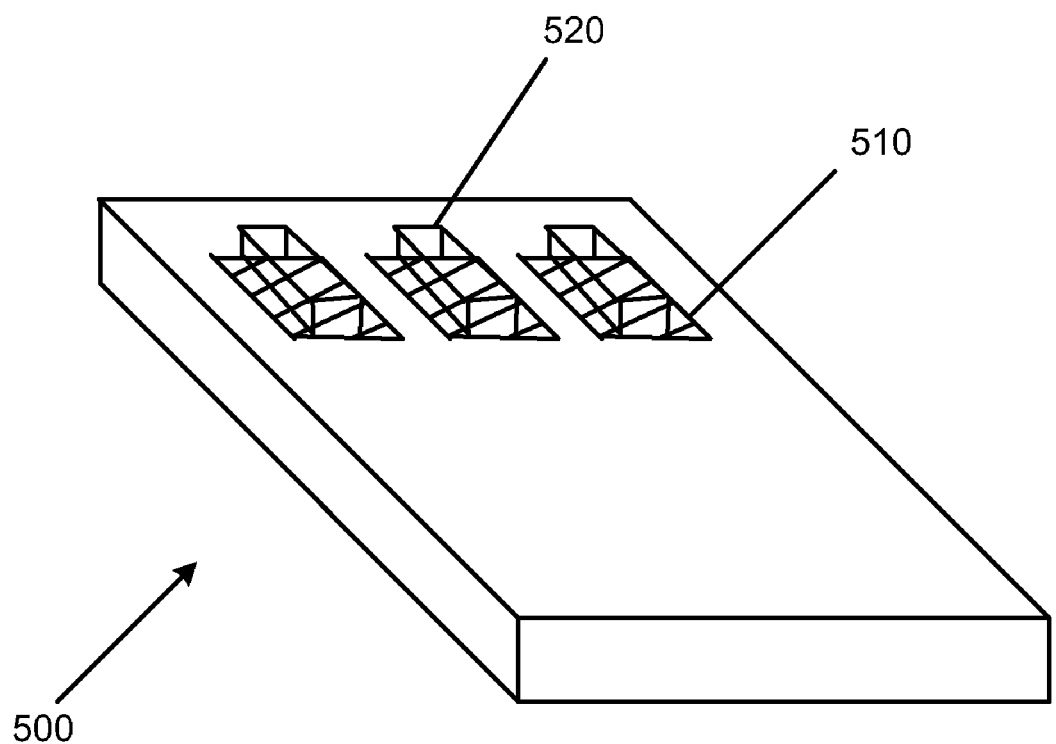
FIG. 5 shows a PxC chip with a patterned high permittivity ferroelectric ceramic material atop the pads in accordance with one or more embodiments of the invention.

FIG. 5 shows a PxC chip 500 with a patterned high permittivity ferroelectric ceramic material 520 atop the pads 510 in accordance with one or more embodiments of the invention. In one or more embodiments, the high permittivity ferroelectric ceramic material 520 may be selected from a group consisting of, but not limited to, $BaTiO_3$, $SrTiO_3$, $BaSrTiO_3$, and $ScTiO_3$. In one or more embodiments, $BaTiO_3$, $SrTiO_3$, and $BaSrTiO_3$ ceramic materials 520 may provide for permittivity enhancement factors of 150, 300, and 1000 respectively. In one or more embodiments, the gap between two PxC chips 500 having signal pads 510 that serve as transmitters and receivers (not shown in FIG. 5) may be filled with oil, in addition to the ceramic material 520 being deposited atop the signal pads 510.

In one or more embodiments, the width of the high permittivity ferroelectric ceramic material 520 atop the pads 510 may be less than the width of the pads 510 as shown in FIG. 5. In one or more embodiments, the width of the high permittivity ferroelectric ceramic material 520 may also be equal to or greater than the width of the pads 510, depending on the electric field characteristics in the PxC set-up the chip 500 is a part of and the relative transmitter and receiver chip sizes. In one or more embodiments, capturing fringing fields is made easy by the high permittivity ferroelectric material 520 atop the pads 510.

In one or more embodiments, parallel plate models described above may be employed to calculate signal levels associated with bare pads with no patterned ferroelectric material. In one or more embodiments, signal levels may be calculated by accounting for the ferroelectric material 520 patterned atop signal pads 510 in the models. In one or more embodiments, the contribution of fields from neighboring pads may be ignored.

Figure 6:
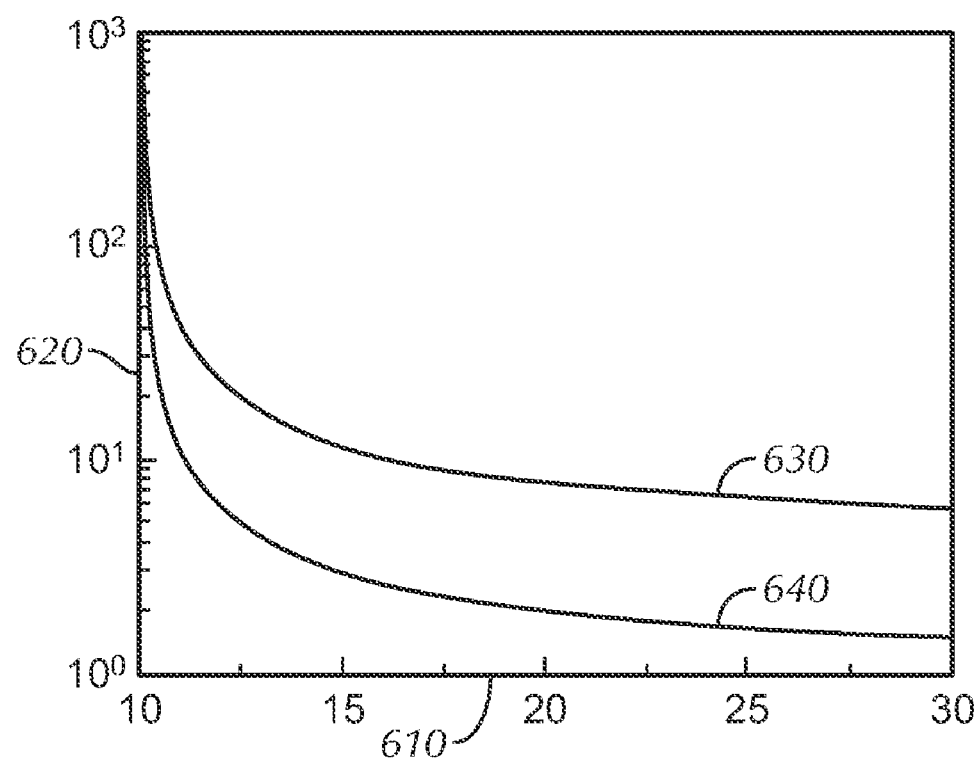
FIG. 6 shows the plot of signal enhancement factor associated with a patterned $ScTiO_3$ pad (with oil between pad gaps and without oil between pad gaps) as a function of chip separation 610 in accordance with one or more embodiments of the invention.

FIG. 6 shows the plot of signal enhancement factor 620 associated with a patterned $ScTiO_3$ pad (with oil between pad gaps 630 and without oil between pad gaps 640) as a function of chip separation 610 in accordance with one or more embodiments of the invention calculated using the parallel plate model described above. The signal enhancement factor 620 is the ratio of the signal levels associated with pads including the $ScTiO_3$ material and the signal levels associated with bare pads with a 10 micron chip-to-chip gap. In one or more embodiments, PxC using high permittivity ferroelectric materials may potentially enable chip separations 610 in excess of 10 microns as it provides for high signal enhancement factors 620 even at increased chip separations 610 as shown in FIG. 6.

Figure 7:
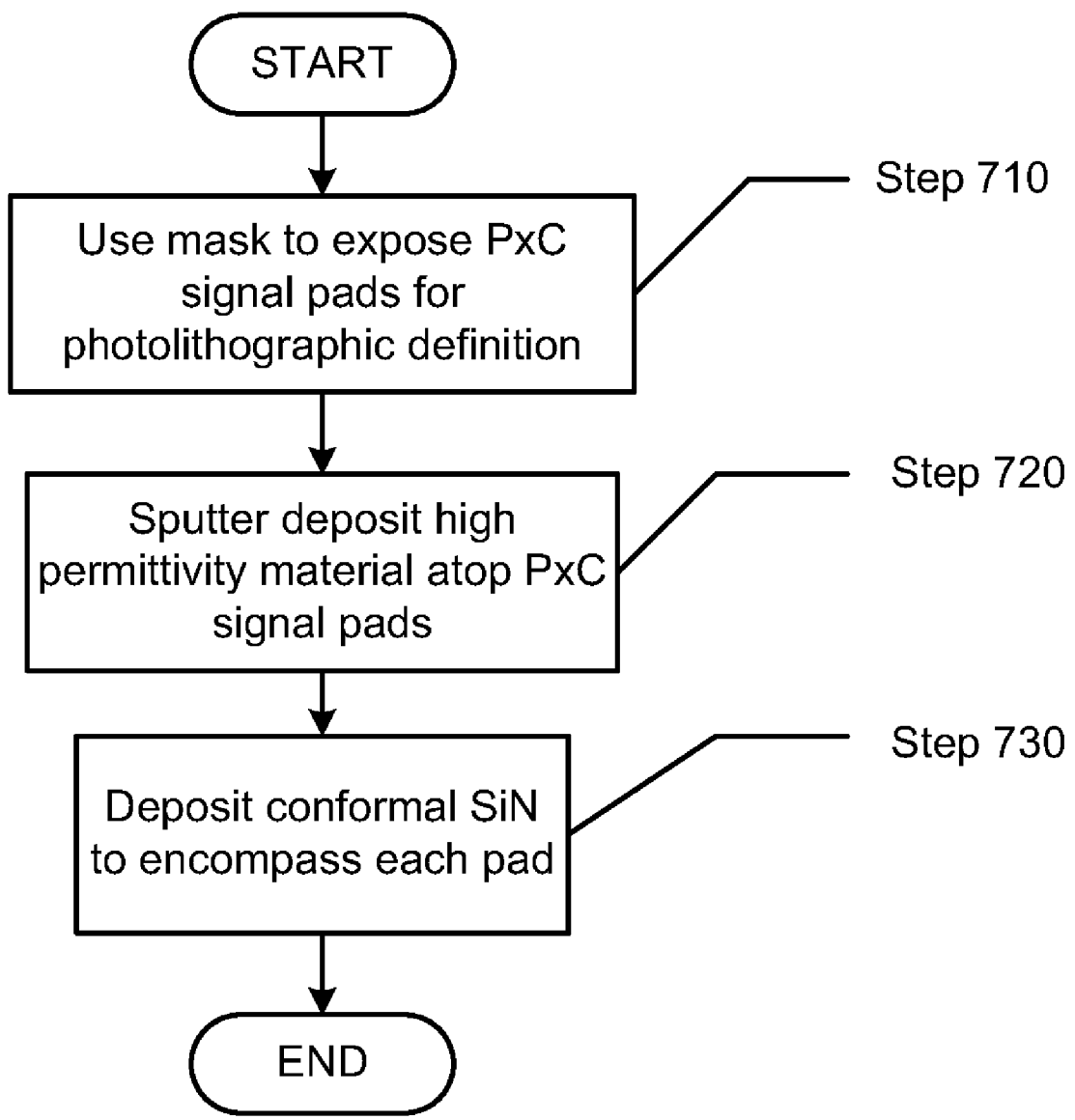
FIG. 7 shows the steps involved in an exemplary method to fabricate a ferroelectric material directly atop a PxC signal pad on a semiconductor/semiconductor-on-insulator substrate in accordance with one or more embodiments of the invention.

FIG. 7 is a flowchart showing the steps involved in an exemplary method to fabricate a ferroelectric material directly atop a PxC signal pad on a semiconductor/semiconductor-on-insulator substrate in accordance with one or more embodiments of the invention. In Step 710, a photolithographic mask may be used to expose the PxC signal pads on the substrate to define areas for high permittivity ferroelectric material deposition. Step 720 then involves sputter deposition of high permittivity ferroelectric material directly atop the PxC signal pads. In one or more embodiments, the sputter deposition may be a physical vapor deposition (PVD) process. In one or more embodiments, the PxC signal pads may be sputter cleaned before the sputter deposition process. In one or more embodiments, the sputter deposition may be plasma-assisted to enable good grain growth of the high permittivity ferroelectric material, along with high densification of the alloy components of the ferroelectric material. In one or more embodiments, the PVD process of sputter deposition may be alternated with RF back-sputtering or chemical etching to form a layer of desired thickness. In one or more embodiments, the aforementioned sputtering, PVD, or plasma assisted sputtering may involve deposition of a ferroelectric doped spin-on glass or a ferroelectric impregnated epoxy as a preliminary step.

Step 730 involves deposition of an insulation coating layer to encompass the PxC signal pads, thereby ensuring environmental encapsulation of the entire surface. In one or more embodiments, a deposition of a thin coating layer of conformal $Si_3N_4$ may provide for the insulation. In one or more embodiments, Chemical Vapor Deposition (CVD) of $SiO_2$ may be used instead of conformal $Si_3N_4$.

In one or more embodiments, step 710 may involve deposition of the high permittivity ferroelectric material over the entire wafer substrate. Step 720 may then involve lithographic patterning over the PxC signal pad areas. In one or more embodiments, the non-patterned high permittivity ferroelectric material may then be etched away in a reactive-ion etching (RIE) or wet etching process. In one or more embodiments, patterning of the ferroelectric material layer may be accomplished by lift-off, silk screening, stenciling or a selective area deposition process. In one or more embodiments, ferroelectric high permittivity materials with thickness approaching 10 microns may be deposited over PxC signal pads. In one or more embodiments, as the ferroelectric high permittivity materials are CMOS compatible, the sputter deposition may be performed at the last level of a CMOS process, with minimal impact to the underlying circuitry.

It will be obvious to one of ordinary skill in the art that individual PxC pads are not limited to a uniform size but may be varied in accordance with the PxC chip-to-chip set-up, and accordingly, the patterning method may be modified to accommodate the variation. The pad sizes and the insulator layers employed may also be varied. High permittivity dielectric materials instead of the exemplary ferroelectrics may also be employed. All of the aforementioned variations are within the scope of the invention.

Advantages of various embodiments of the invention may include one or more of the following. In one or more embodiments, use of high permittivity dielectric materials may ensure that the electric fields are entirely confined to the pad space between chips. In one or more embodiments, high permittivity dielectric materials may allow for significantly larger chip separation when compared to air-gaps, which are smaller than 8 microns to allow for significant pad-to-pad signal coupling.

In one or more embodiments, a group of chips having varied functionalities, such as a processor and a memory, may be brought in PxC with high permittivity ferroelectric materials atop signal pads. In one or more embodiments, individual chips engaged in such PxC coupling may be of different sizes as the small chip air-gap requirements may be relaxed when high permittivity dielectric materials are used. In one or more embodiments, PxC coupling with high permittivity dielectric materials may potentially enable for large chip separations while providing for signal levels higher than that of an ideally aligned chip with only 1 micron of air-gap between chips. In one or more embodiments, such a large chip separation would ease removal and replacement of flawed chips.

In one or more embodiments, the sputter deposition of high permittivity dielectric materials atop PxC signal pads may be performed at the last level of a CMOS process, as discussed above. In one or more embodiments, crosstalk between small signal pads may be reduced by increased coupling levels between PxC pads with high permittivity dielectric materials. In one or more embodiments, manufacturing complexity, cost of alignment, and cost of packaging may be reduced in a PxC chip-to-chip configuration with high permittivity dielectric material layers, with excellent signal fidelity between signal pads of opposing chips.

While the invention has been described with respect to an exemplary embodiment of a method for increasing coupling between signal pads of chips engaged in PxC, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for improving signal levels between capacitively-coupled chips in proximity communication (PxC), the method comprising:
    depositing a high permittivity dielectric material layer over a signal pad of a first chip; and
    placing a second chip in close proximity to the first chip such that a face of a signal pad of the second chip is aligned with a face of the signal pad of the first chip to enable for capacitive signal coupling, with the face of the signal pad of the first chip being an area of deposition of the high permittivity dielectric material layer,
    wherein the high permittivity dielectric material layer fills at least a portion of a gap between the first chip and the second chip, and
    wherein the high permittivity dielectric material layer improves capacitive coupling between signal pads of the first chip and the second chip by providing for an increased permittivity in the gap between the first chip and the second chip, with the increased permittivity ensuring that electric fields are substantially confined to a space between the signal pad of the first chip and the signal pad of the second chip
    wherein at least one of a width and a length of the deposited high permittivity dielectric material layer perpendicular to the gap between the first chip and the second chip is less than or equal to at least one of a width and a length of the signal pad of the first chip.

2. The method according to claim 1, wherein the high permittivity dielectric material layer is a ferroelectric material layer.

3. The method according to claim 2, wherein the ferroelectric material layer comprises at least one material selected from the group consisting of $BaTiO_3$, $SrTiO_3$, $BaSrTiO_3$, and $ScTiO_3$.

4. The method according to claim 2, wherein the deposition of the ferroelectric material layer directly atop the signal pad of the first chip is performed by at least one of: sputtering, a Physical Vapor Deposition (PVD) process, and plasma-assisted sputtering.

5. The method according to claim 4, wherein at least one of: sputtering, PVD process, and plasma-assisted sputtering used to deposit the ferroelectric material layer involves deposition of one of: a ferroelectric doped spin-on glass and a ferroelectric impregnated epoxy as a preliminary step.

6. The method according to claim 1, wherein the width of the deposited high permittivity dielectric material layer perpendicular to the gap between the first chip and the second chip is less than or equal to the width of the signal pad of the first chip and the length of the deposited high permittivity dielectric material layer perpendicular to the gap between the first chip and the second chip is greater than the length of the signal pad of the first chip.

7. The method according to claim 1, wherein a photolithographic mask is employed to expose the signal pad of the first chip prior to deposition of the high permittivity dielectric material layer.

8. The method according to claim 1, wherein a photolithographic mask is employed to pattern the high permittivity dielectric material layer after deposition of the high permittivity dielectric material layer.

9. The method according to claim 8, wherein non-patterned portions of the high permittivity dielectric material layer are etched away in at least one of: a reactive-ion etching (RIE) and a wet etching process.

10. The method according to claim 1, wherein a patterning of the high permittivity dielectric material layer is accomplished by one of: a lift-off, silk screening, stenciling, and a selective area deposition process.

11. The method according to claim 1, wherein deposition of the high permittivity dielectric material layer further comprises deposition of an insulating layer over the high permittivity dielectric material layer and exposed portions of the signal pad of the first chip not coated by the high permittivity dielectric material layer.

12. The method according to claim 11, wherein the insulating layer comprises at least one of:
    $Si_3N_4$, and
    $SiO_2$ deposited by a Chemical Vapor Deposition (CVD) process.

13. The method according to claim 1, further comprising filling the gap between the signal pad of the first chip and the signal pad of the second chip not occupied by the high permittivity dielectric material layer with oil.

14. The method according to claim 1, wherein deposition of the high-permittivity dielectric material layer is performed at a last level of a CMOS process.

15. The method according to claim 1, wherein the length of the deposited high permittivity dielectric material layer perpendicular to the gap between the first chip and the second chip is less than or equal to the length of the signal pad of the first chip and the width of the deposited high permittivity dielectric material layer perpendicular to the gap between the first chip and the second chip is greater than the width of the signal pad of the first chip.

16. A processing unit that provides for increased signal coupling between capacitively-coupled chips, the processing unit comprising:
    a first semiconductor chip comprising a signal pad atop which a high permittivity dielectric material layer is deposited; and
    a second semiconductor chip in proximity to the first semiconductor chip such that a face of a signal pad of the second chip is aligned with a face of the signal pad of the first chip to enable for capacitive signal coupling, with the face of the signal pad of the first chip being an area of deposition of the high permittivity dielectric material layer, wherein the high permittivity dielectric material layer fills at least a portion of a gap between the first chip and the second chip, and wherein the high permittivity dielectric material layer improves capacitive coupling between signal pads of the first chip and the second chip by providing for an increased permittivity in the gap between the first chip and the second chip, with the increased permittivity ensuring that electric fields are substantially confined to a space between the signal pad of the first chip and the signal pad of the second chip wherein at least one of a width and a length of the deposited high permittivity dielectric material layer perpendicular to the gap between the first semiconductor chip and the second semiconductor chip is less than or equal to at least one of a width and a length of the signal pad of the first semiconductor chip.

17. The processing unit according to claim 16, wherein the high permittivity dielectric material layer is a ferroelectric material layer.

18. The processing unit according to claim 17, wherein the ferroelectric material layer comprises a material selected from a group consisting of $BaTiO_3$, $SrTiO_3$, $BaSrTiO_3$, and $ScTiO_3$.

19. The processing unit according to claim 16, wherein the width of the deposited high permittivity dielectric material layer perpendicular to the gap between the first semiconductor chip and the second semiconductor chip is less than or equal to the width of the signal pad of the first semiconductor chip and the length of the deposited high permittivity dielectric material layer perpendicular to the gap between the first semiconductor chip and the second semiconductor chip is larger than the length of the signal pad of the first semiconductor chip.

20. The processing unit according to claim 16, wherein oil is used to the fill the gap between the signal pad of the first semiconductor chip and the signal pad of the second semiconductor chip not occupied by the high permittivity dielectric material layer.

21. The processing unit according to claim 16, wherein at least one of:
the first semiconductor chip and the second semiconductor chip are of different dimensions, and
the signal pad of the first semiconductor chip and the signal pad of the second semiconductor chip are of different dimensions.

22. The processing unit according to claim 16, wherein the length of the deposited high permittivity dielectric material layer perpendicular to the gap between the first semiconductor chip and the second semiconductor chip is less than or equal to the length of the signal pad of the first semiconductor chip and the width of the deposited high permittivity dielectric material layer perpendicular to the gap between the first semiconductor chip and the second semiconductor chip is larger than the width of the signal pad of the first semiconductor chip.

* * * * *